(12) United States Patent
Gaboriau et al.

(10) Patent No.: US 6,462,690 B1
(45) Date of Patent: Oct. 8, 2002

(54) CIRCUIT SYSTEMS AND METHODS FOR MULTIRATE DIGITAL-TO-ANALOG AMPLIFIER SYSTEMS

(75) Inventors: Johann Guy Gaboriau, Austin, TX (US); Xiaofan Fei, Austin, TX (US); Evan Logan Marchman, Austin, TX (US); Jason Powell Rhode, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/825,445

(22) Filed: Apr. 2, 2001

(51) Int. Cl.$^7$ .................................................. H03M 1/66
(52) U.S. Cl. ...................... 341/144; 341/143; 341/61; 341/50; 341/77; 341/79; 455/560; 381/119
(58) Field of Search .................................. 341/143, 144, 341/61, 152

(56) References Cited

U.S. PATENT DOCUMENTS

| | | | |
|---|---|---|---|
| 5,585,802 A | * 12/1996 | Cabler et al. | ............... 341/144 |
| 5,982,305 A | * 11/1999 | Taylor | ........................ 341/50 |
| 5,995,850 A | * 11/1999 | Goud et al. | ................. 455/560 |
| 6,313,765 B1 | * 11/2001 | Keefer | ........................ 341/61 |
| 6,337,645 B1 | * 1/2002 | Pflaumer | .................... 341/143 |
| 6,373,954 B1 | * 4/2002 | Malcolm et al. | ............ 381/119 |
| 6,392,579 B1 | * 5/2002 | Rezvani et al. | ............. 341/144 |

* cited by examiner

*Primary Examiner*—Michael Tokar
*Assistant Examiner*—Lam T. Mai
(74) *Attorney, Agent, or Firm*—Barry S. Newberger; Winstead Sechrest & Minick P.C.

(57) ABSTRACT

A multirate digital-to-analog amplifier system is disclosed. An interpolator is configured to interpolate digital values between samples of a digital signal from a digital signal source, in which the digital signal has a first sample rate. An output signal from the interpolator has a second, predetermined sample rate, which is independent of the first sample rate, of the digital signal. An amplifier is configured to amplify a digital signal having the second sample rate in response to the output signal of the interpolator.

18 Claims, 3 Drawing Sheets

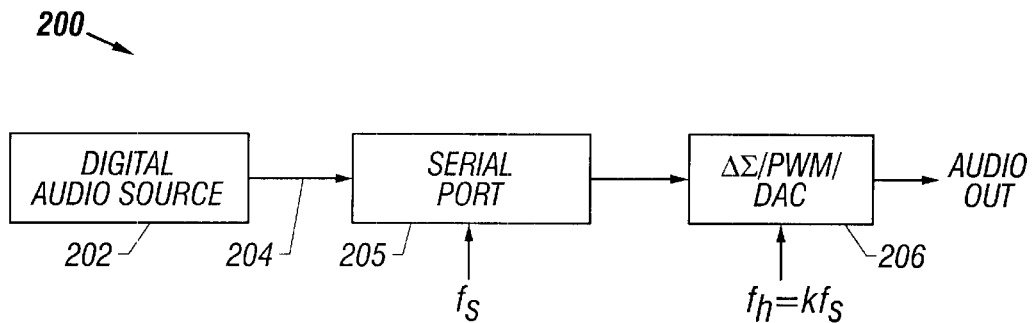
FIG. 2.1
*(Prior Art)*
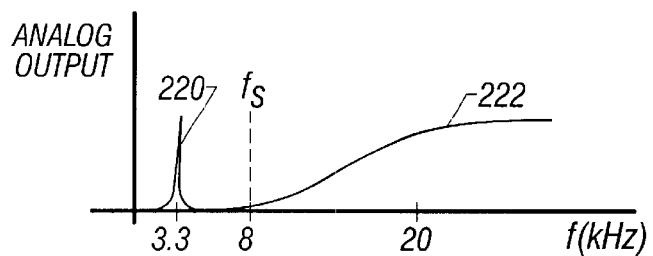
FIG. 2.2
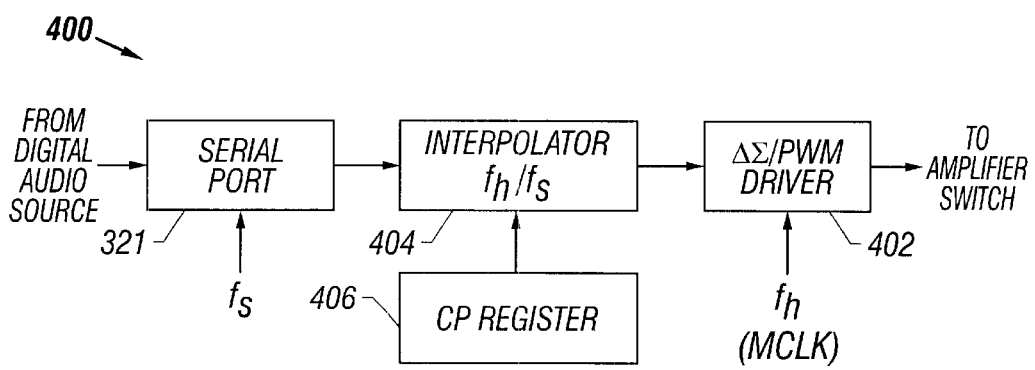
FIG. 4

CIRCUIT SYSTEMS AND METHODS FOR MULTIRATE DIGITAL-TO-ANALOG AMPLIFIER SYSTEMS

BACKGROUND OF THE INVENTION

1. Field of the Invention

The present invention relates in general to digital to analog converter (DAC) amplifier systems, and in particular to the operation of a delta-sigma DACs at multiple ratios of the input data rate to the oversampling rate.

2. Description of the Related Art

Class D audio power amplifiers (APAs) have been used for many years in systems, such as wireline telephony, where high bandwidth is not critical. More recently however, new fabrication techniques, and in particular, new techniques for fabricating power transistors, have made integrated class D APAs possible. This has extended their potential applications to lower-power, higher-bandwidth systems, including battery-powered portable music players and wireless communications devices.

One major advantage of class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above ninety percent (90%). In contrast, the typical class AB push-pull amplifier, using output transistors whose conduction varies linearly during each half-cycle, has an efficiency of around sixty percent (60%). The increased efficiency of class D amplifiers in turn reduces power consumption and consequently lowers heat dissipation and improves battery life in portable systems.

As previously described, in a class D amplifier, efficiency is gained by switching the power devices hard between the power supply rails. The high frequency noise is then filtered with a low pass filter. Typically, the low pass filter is of the passive type, including inductive and/or capacitive reactive elements to smooth the signal. FIG. 1 illustrates, in block diagram form, a typical class D amplifier system 100. Amplifier system 100 includes class D amplifier 102 containing MOSFET switch 104 and delta-sigma ($\Delta\Sigma$) converter/PWM controller 106 receives a digital input signal, which constitutes the signal to be amplified. Typically, the digital signal may be a digitized audio signal, and the amplified output signal, after conversion to an analog signal as discussed below, provided to an audio transducer, such as a speaker or headphone for presentation to a human listener. However, other signals with a similar bandwidth may be the source of the digital signal, for example, a control signal in a digital feedback loop applied to an analog controller, and the inventive principles to be described may be used with such systems as well. The digital input signal may be high resolution, low data rate data, which may be converted to low resolution, high data rate data by delta-sigma converter portion of delta-sigma converter/PWM 106. (For example, the digital input signal may be twenty-four bit data at a 44 kHz rate, while the PWM output may be five bit, 1.1 MHz data.) MOSFET switch 104 may constitute a fill bridge amplifier. The duty cycle of the PWM signal is proportional to the (quantized) amplitude of the information signal. In other words, for each sample period, the relative time duration of the "high" and "low" levels of the PWM signal into MOSFET switch 106 are proportional to the quantized amplitude of the information signal, and consequently the relative time intervals during which the output of the amplifier, ahead of LPF 110, is pulled up and pulled down is similarly proportional to the audio signal amplitude. (PWM signal generation techniques are discussed in the commonly owned U.S. Pat. No. 5,815, 102 to Melanson, entitled "Delta-sigma PWM DAC to Reduce Switching," incorporated herein by reference.) The amplified information is recovered via low pass filter (LPF) 110, which provides the analog output to a load, Z.

As discussed above, the digital information input may be "high" resolution, low rate data while the PWM and switch operate at a high data rate with "low" resolution data. The sampling rate of the high data rate signal may be determined by a clock with frequency $f_h$. The low data rate may be determined the sample frequency of the digital information with frequency $f_s$. This may be further appreciated by referring to FIG. 2.1, illustrating, in a high level block diagram, a digital audio system 200 in accordance with the prior art. A digital audio source 202 provides digital audio signal 204 to a delta-sigma converter/PWM/DAC 206 via serial port 205. (Serial port 205 receives digital audio signal 204 in a serial format and converts it to a parallel format used by the subsequent circuitry.) An analog audio output appears at the output of delta-sigma converter/PWM/DAC 206. Typically, the ratio of the frequencies, $k=f_h/f_s$, may be a predetermined value, for example, 64, 128, 256 etc. Thus, the sample rate of the digital information signal determines the frequency $f_h$. For a digital audio signal derived from a low frequency audio source, a voiceband signal, for example, the sample rate, $f_s$ may be concomitantly low, in accordance with the Nyquist sampling theorem. As a consequence, the output of the amplifier system may contain a significant noise component arising from the quantization noise spectrum, a portion of which is "in-band" with the PWM operating at the corresponding frequency, $f_h$. This may be further appreciated by referring to FIG. 2.2 qualitatively illustrating a frequency spectrum of the audio output for a system such as system 200, FIG. 2.1. The output includes a voiceband signal 220 (shown centered near 3.3 kHz, at the upper end of the voiceband range). A typical sampling frequency of the digital audio signal, $f_s$, of 8 kHz is shown. Quantization noise spectrum 222 exhibits a significant noise power in the audible range below 20 kHz. Thus, there is a need in the art for systems and methods to reduce in-band noise in PWM systems operated with "low" frequency input signals.

SUMMARY OF THE INVENTION

According to the principles of the present invention, multirate digital-to-analog amplifier system is disclosed. The system includes a digital signal source. A programmable interpolator is configured to interpolate digital values between samples of a digital signal from the digital signal source. The digital signal has a first sample rate and an output of the interpolator has a second, predetermined sample rate which is independent of the first sample rate. The system also includes an amplifier configured to amplify a digital signal having the second sample rate in response to the output signal of the interpolator.

The inventive concept addresses a problem in DAC amplifier systems namely, in-band noise in DAC amplifiers when amplifying signals with spectra limited to the low end of the audio range, for example, voiceband signals, or similar. Conventional DAC amplifier systems have a fixed ratio of the PWM/DAC sampling frequency to sampling frequency of the signal to be amplified. At typical values of the ratio, the quantization noise in the DAC amplifier system within the bandwidth of the analog output is significant. The interpolator interpolates data values between the samples, at the first sample rate, of the digital signal to be amplified, and the output of the interpolator at the second data rate. The second data rate is a predetermined data rate independent of the first sample rate. The amplifier amplifies a signal at the second data rate in response to the interpolator output, whereby the in-band portion of the analog output noise spectrum is unobjectionable.

BRIEF DESCRIPTION OF THE DRAWINGS

For a more complete understanding of the present invention, and the advantages thereof, reference is now made to the following descriptions taken in conjunction with the accompanying drawings, in which:

FIG. 2.1 illustrates, in high-level block diagram form, a portion of a digital audio system in accordance with the prior art;

FIG. 2.2 illustrates, in schematic graphical form, an output spectrum of an audio system in accordance with the principles of FIG. 2.1;

FIG. 4 illustrates, in block diagram form, a portion of a digital audio system in accordance with an embodiment of the present invention.

DETAILED DESCRIPTION

Figure 1:
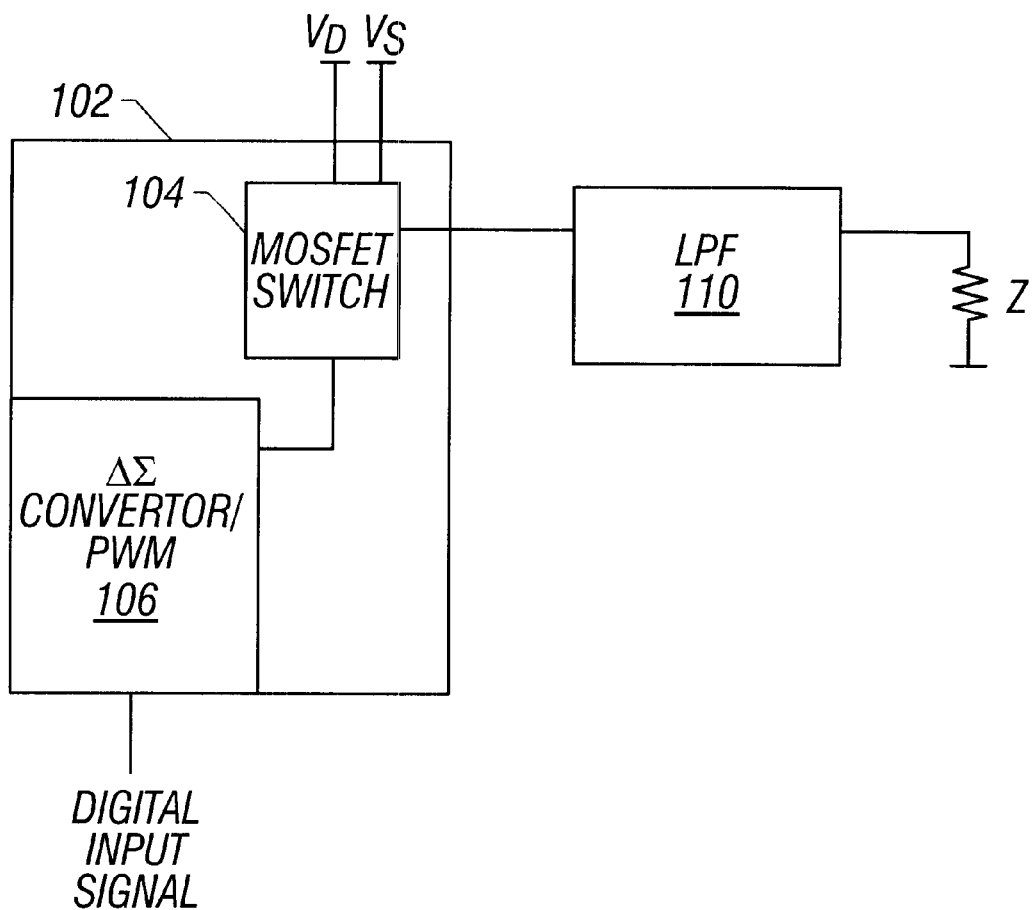
FIG. 1 illustrates, in high-level block diagram form, an amplifier system which may be used with the present invention.

In the following description, numerous specific details are set forth, such as specific data rates, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 3:
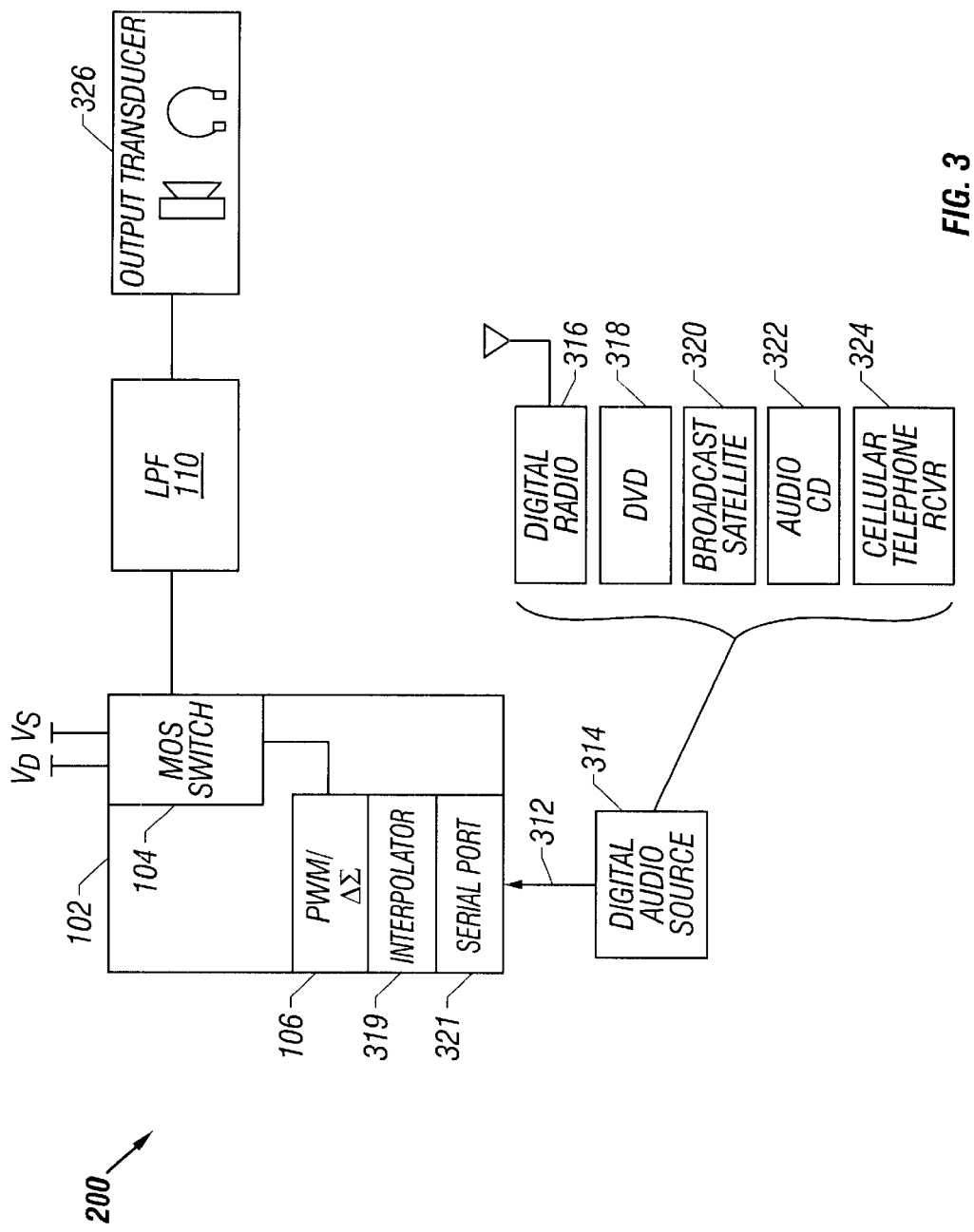
FIG. 3 illustrates, in block diagram form, a digital audio system in accordance with the principles of the present invention.

Refer now to FIG. 3 illustrating an audio system 300 in accordance with the principles of the present invention. System 300 includes amplifier system 102, digital audio source 314 and output transducer 326 (such as a speaker, headphones, or other analog transducer). Amplifier system 102 includes, in addition to switch 104, interpolator 319 and pulse-width modulator/delta-sigma converter 106. Amplifier 102 receives a digital signal 312 which may be a digital audio signal. Digital signal 312 may be a conventional pulse code modulated (PCM) digital representation of an analog signal. Additionally, digital signal source 314 may be interfaced to amplifier 102 system via serial port 321. Digital signal source 314 may include one or more of a digital radio 316, digital video disk (DVD) player 318, direct broadcast satellite 320, audio compact disk (CD) 322, or cellular telephone receiver (RCVR) 324 (which may be the receive portion of a cellular telephone transceiver).

In FIG. 4, is illustrated portion 400 of an amplifier, such as amplifier 102, FIGS. 1 and 2, in accordance with the principles of the present invention. Portion 400 includes serial port that is clocked at the sampling frequency of the digital audio signal, $f_s$. The digital audio signal, which may be high-resolution, low rate data, as previously discussed, may be converted to low-resolution, high rate data in delta-sigma converter/PWM driver 402, which drives an amplifier switch, such as switch 104 FIGS. 1 and 2. Delta-sigma converter/PWM driver 402 is clocked by a master clock (MCLK) having a predetermined sampling frequency, $f_h$. The frequency of the master clock is predetermined in accordance with the implementation of delta-sigma converter/PWM driver 402, and is not dependent on the sampling frequency of the digital audio signal. Higher clock frequencies generally ameliorate noise, that is improve noise performance of the converter, but complicate the implementation of the converter, as well as increase power consumption. A typical clock frequency might be 384 kHz in a thirty-two bit DAC implementation. The ratio of the frequency of the master clock and the sampling frequency of the digital audio signal, $f_s$ is variable. Programmable interpolator 404 interpolates the low rate data between the rate $f_s$ and the sampling rate $f_h$ of the delta-sigma converter/PWM. An interpolation value representing the ratio of the sampling frequencies, $f_h/f_s$, is set in control register 406 in accordance with the sampling rate of the particular digital audio source coupled to the amplifier, and the frequency of the master clock. The number of interpolated data values between samples of the digital signal is selected in response to the ratio of sampling frequencies in register 406. Because the quantization noise introduced by delta-sigma converter/PWM driver 402 is determined by the frequency of the master clock, the noise appearing within the bandwidth of the analog output (not shown in FIG. 4) may be limited to unobtrusive levels, independent of the sampling frequency of the digital audio signal.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed may be readily used as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed:

1. An multirate digital-to-analog amplifier system comprising:

a digital signal source;

an interpolator configured to interpolate digital values between samples of a digital signal from said digital signal source in response to a selected interpolation value, wherein said digital signal has a first sample rate, and an output signal from said interpolator having a second, predetermined sample rate, said second sample rate being independent of said first sample rate; and an amplifier configured to amplify a digital signal having said second sample rate in response to said output signal of said interpolator.

2. The system of claim 1 further including a register for storing said interpolation value corresponding to a ratio of said second and first sample rates, said register coupled to said interpolator, said interpolator providing an number of interpolated values in response to said digital value.

3. The system of claim 2 wherein said amplifier comprises:
- a delta-sigma converter coupled to an output of said programmable interpolator; and
- a pulse-width modulator (PWM) coupled to said delta-sigma converter, said PWM configured to drive said amplifier.

4. The system of claim 3 wherein said amplifier further comprises a metal oxide semiconductor field effect transistor switch.

5. The system of claim 1 further comprising a serial port configured to said digital signal in a first format from said digital signal source and output said digital signal, in a second format, to said interpolator.

6. The system of claim 1 wherein said digital signal source comprises a digital audio source.

7. The system of claim 1 wherein said predetermined second sample rate corresponds to a predetermined clock frequency, said predetermined clock frequency being independent of said first sample rate.

8. An apparatus for multirate digital-to analog amplification comprising:
- an interpolator configured to interpolate digital values between samples of a digital signal in response to selected interpolation value, wherein said digital signal has a first sample rate, and an output signal from said interpolator has a second, predetermined sample rate; and
- a register for storing said interpolation value corresponding to a ratio of said second and first sample rates, said register coupled to said interpolator, said interpolator providing an number of interpolated values in response to said digital value.

9. The apparatus of claim 8 further comprising a delta-sigma converter configured to receive, from said interpolator, said samples of said digital signal and interpolated digital values.

10. The apparatus of claim 9 further comprising a pulse-width modulator configures to receive an output signal from said delta-sigma converter, said output signal from said delta-sigma converter having a smaller number of bits than a number of bits in said digital signal.

11. The apparatus of claim 8 further comprising a serial port configured to receive said digital signal in a first format from said digital signal source and output said digital signal, in a second format, to said interpolator.

12. The apparatus of claim 1 wherein said predetermined second sample rate corresponds to a predetermined clock frequency, said predetermined clock frequency being independent of said first sample rate.

13. A multirate digital-analog amplifier method comprising the steps of:
- interpolating a set of digital values between samples of a first digital signal, wherein said digital signal has a first sample rate, an output signal from said interpolator having a second, predetermined sample rate;
- selecting a number of interpolated data values per unit time in response to a ratio of said second sample rate and said first sample rate.

14. The method of claim 13 wherein said step of selecting a number of interpolated data values includes storing a digital value representing said ratio of second sample rate and first sample rate in a register.

15. The method of claim 13 further comprising the step of converting said digital signal from a first format to a second format, said second format configured for said step of interpolating said set of digital values.

16. The method of claim 13 further comprising a step of converting said set of digital values and first digital signal to second digital signal having a smaller number of bits than said first digital signal.

17. The method of claim 16 further comprising the step of generating a pulse-width modulated digital signal in response to said second digital signal.

18. The method of claim 17 further comprising the step of driving an amplifier switch using said pulse-width modulated digital signal.

* * * * *